(12) United States Patent
Kumashiro et al.

(10) Patent No.: US 6,242,272 B1
(45) Date of Patent: Jun. 5, 2001

(54) REVERSE PROFILING METHOD FOR PROFILING MODULATED IMPURITY DENSITY DISTRIBUTION OF SEMICONDUCTOR DEVICE

(75) Inventors: Shigetaka Kumashiro; Kiyoshi Takeuchi, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/366,321

(22) Filed: Aug. 2, 1999

(30) Foreign Application Priority Data

Jul. 31, 1998 (JP) ................................. 10-217952

(51) Int. Cl.[7] ................................. H01L 21/66
(52) U.S. Cl. ................................. 438/14; 257/139
(58) Field of Search ................................. 257/296, 286, 257/401, 59, 139; 438/257

(56) References Cited

U.S. PATENT DOCUMENTS

| | | | |
|---|---|---|---|
| 5,147,811 | * 9/1992 | Sakagami | 438/257 |
| 5,734,188 | * 3/1998 | Murata | 257/401 |
| 5,917,211 | * 6/1999 | Murata | 257/296 |
| 6,037,619 | * 3/2000 | Morizuka | 257/280 |
| 6,147,375 | * 11/2000 | Yamazaki | 257/296 |
| 6,160,271 | * 12/2000 | Yamazaki | 257/59 |

OTHER PUBLICATIONS

Z. K. Lee et al., "Inverse Modeling of MOSFETs Using I–V Characteristics in the Subthreshold Region", *IEDM Tech. Dig.*, 1997, pp. 683–685.

* cited by examiner

*Primary Examiner*—John F. Niebling
*Assistant Examiner*—Andre' C Stevenson
(74) *Attorney, Agent, or Firm*—Sughrue, Mion, Zinn, Macpeak & Seas, PLLC

(57) ABSTRACT

In a reverse profiling method, first and second processes produce first and second groups of MOSFETs, respectively. In the first process, channel impurities are implanted into a semiconductor substrate after implantation of source/drain impurities and annealing of the semiconductor substrate. Consequently, the annealing modulates channel impurity density distribution. On the other hand, in the second process, source/drain impurities are implanted into a semiconductor substrate after implantation of channel impurities and annealing of the semiconductor substrate. The annealing does not modulate channel impurity density distribution in the second process. First threshold voltage-gate length characteristics of the MOSFETs of the first group are found. Similarly, second threshold voltage-gate length characteristics of the MOSFETs of the first group are found. Finally, modulated impurity density distribution of the MOSFET of the first group is found on the basis of said first threshold voltage-gate length characteristics and said second threshold voltage-gate length characteristics.

7 Claims, 6 Drawing Sheets

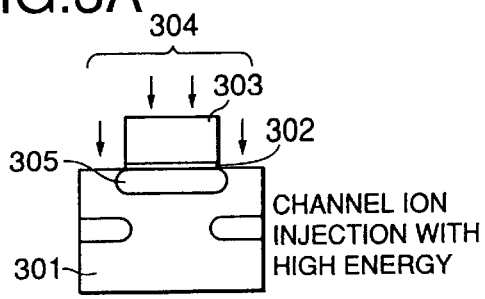
FIG.3A
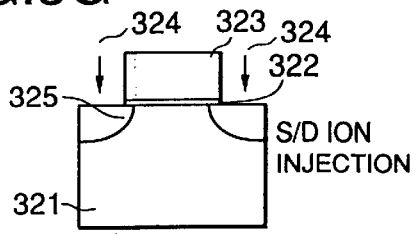
FIG.3G
FIG.3B ⇩
RTA
FIG.3C
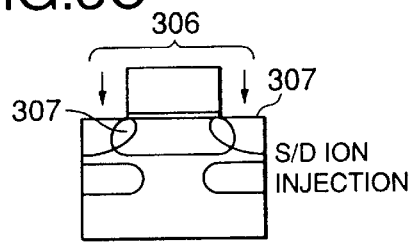
FIG.3H ⇩
ANNEALING
FIG.3I
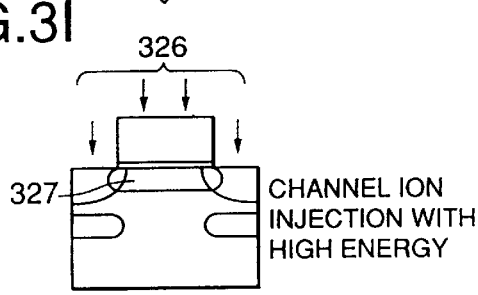
FIG.3D ⇩
ANNEALING
FIG.3E ⇩
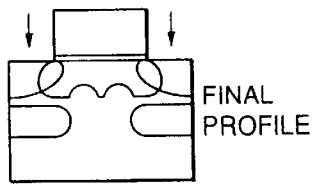
FIG.3J ⇩
RTA
FIG.3K
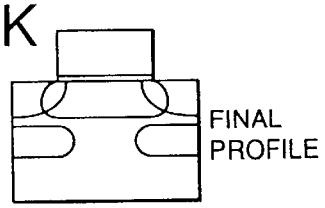
FIG.3F ⇩
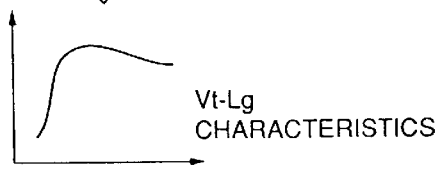
CHANNEL PRECEDING IMPLANTED DEVICE
FIG.3L ⇩
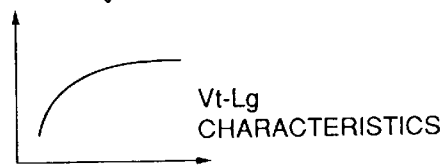
S/D PRECEDING IMPLANTED DEVICE

FIG.6A — 601, 604, 603 CHANNEL ION IMPLANTATION, 602

FIG.6B — 606, 605, 607, 604, 607, 602 S/D ION IMPLANTATION

FIG.6C — 608, 608

Si ION INJECTION

FIG.6D ANNEALING

FIG.6I ANNEALING

FINAL PROFILE

Vt-Lg CHARACTERISTICS

Si ION IMPLANTED DEVICE

GENERAL DEVICE

REVERSE PROFILING METHOD FOR PROFILING MODULATED IMPURITY DENSITY DISTRIBUTION OF SEMICONDUCTOR DEVICE

BACKGROUND OF THE INVENTION

This invention relates to a reverse profiling method for profiling a modulated impurity density distribution of a semiconductor device.

An impurity density distribution of a semiconductor device is an important factor, which affects electric characteristics of the semiconductor device. Accordingly, measurement of the impurity density of the semiconductor device is very important to analyze or inspect the semiconductor device. In other words, it is very important to extract the impurity density distribution profile of the semiconductor device for analysis or inspection of the semiconductor device.

However, it is very difficult to directly measure the impurity density of the semiconductor device. Therefore, a reverse profiling method is used for profiling the impurity density distribution.

A conventional reverse profiling method measures actual electric characteristics of the semiconductor device while it performs simulation to find simulative electric characteristics of the semiconductor device. Initial parameters used in the simulation are decided on the basis of producing condition of the semiconductor device. The simulation is repeated until the simulative electric characteristics practically match the measured actual electric characteristics. Parameters used in the simulation are changed whenever the simulation is repeated. When the simulative electric characteristics practically match the measured actual electric characteristics, the parameters used in the simulation are substituted in a predetermined analytical equation to find the impurity density distribution.

Such a reverse profiling method is proposed by Z. K. Lee et al. in their article of "Inverse Modeling of MOSFETs USING I-V Characteristics in the Subthreshold Region", IEDM Tech. Dig., pp683–685, 1997.

By the way, in a production of an MOSFET, source/drain impurities are implanted into a substrate, which is annealed after to activate the source/drain impurities. The annealing process acceleratingly diffuses the channel impurities located beside the source/drain regions. That is, the annealing modulates distribution of the channel impurities. The conventional reverse profiling method can find an approximate profile of the modulated distribution of the channel impurities together with an approximate profile of the source/drain impurity density distribution.

However, the conventional reverse profiling method can not quantitatively find modulation effect of the annealing process to the channel impurity density distribution. This is because the conventional reverse profiling method uses the measured electric characteristics of only one type of the MOSFETs.

Moreover, the conventional reverse profiling method needs a long time to match the simulative electric characteristics with the measured actual electric characteristics. This is because the conventional reverse profiling method repeats the simulation with change of the parameters.

Still moreover, the found profile by the conventional reverse profiling method is not always unique. This is because the parameters are changed at a time to extract plural profiles at the same time in the conventional reverse profiling method.

SUMMARY OF THE INVENTION

It is therefore an object of this invention to provide a reverse profiling method that easily finds a modulated impurity density distribution of a semiconductor device.

It is another object of this invention to provide a reverse profiling method that quantitatively finds a modulated impurity density distribution of a semiconductor device.

It is still another object of this invention to provide a reverse profiling method that uniquely finds a modulated impurity density distribution of a semiconductor device.

Other object of this invention will become clear as the description proceeds.

On describing the gist of this invention, it is possible to understand that a reverse profiling method is for profiling a modulated impurity density distribution of a specific semiconductor device with a specific structure. The specific semiconductor device is produced by a first producing process which invites inverse short channel effect.

According to the gist of this invention, the reverse profiling method comprises the steps of producing first semiconductor devices by the first producing process so that the semiconductor devices have the specific structure in common except for gate length, finding first threshold voltage-gate length characteristics based on threshold voltages and gate length of the first semiconductor devices, producing second semiconductor devices by second producing process which is more hard to invite the inverse short channel effect than the first producing process so that the second semiconductor devices have the specific structure in common except for gate length, finding second threshold voltage-gate length characteristics based on threshold voltages and gate length of the second semiconductor devices, and finding the modulated impurity density distribution of the specific semiconductor device on the basis of the first threshold voltage-gate length characteristics and the second threshold voltage-gate length characteristics.

BRIEF DESCRIPTION OF THE DRAWING

FIGS. 3A through 3L are process chart for describing the reverse profiling method of FIG. 2;

FIGS. 6A through 6K are process chart for describing a reverse profiling method according to a second embodiment of this invention.

DESCRIPTION OF THE PREFERRED EMBODIMENTS

Figure 1:
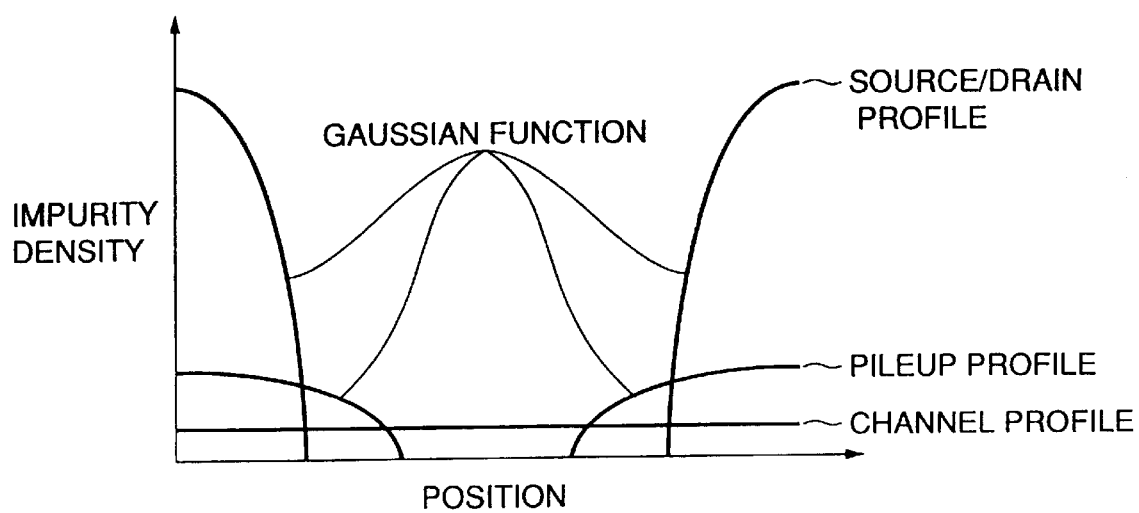
FIG. 1 shows impurity density profiles used in a conventional reverse profiling method.

Referring to FIG. 1, description will be at first directed to a conventional reverse profiling method for a better understanding of this invention.

At first, in the conventional reverse profiling method, a semiconductor device is prepared as an object of extraction of impurity density distributions. The impurity density distributions are, for example, a channel impurity density profile and source/drain impurity density profiles.

Next, the impurity density distributions are assumed as shown in FIG. 1. That is, the channel impurity density profile is flat regardless of the position. The source/drain impurity density profiles are represented by analytical equations, such as Gaussian functions. In addition, pileup impurity density profiles are represented by other analytical equations. Each of the analytical equations includes a plurality of parameters that affect electric characteristics of the semiconductor device. Initial values of the parameters are decided by producing condition of the semiconductor device.

Next, measurement is made to measure the electric characteristics of the semiconductor device.

Then, a simulation is carried out by the use of the parameters to find simulative electric characteristics of the semiconductor device. Succeedingly, comparison of the measured electric characteristics with the simulative electric characteristics is conducted. If the simulative electric characteristics practically match the measured electric characteristics, the analytical equations, that the parameters used in simulation are substituted in, represent the impurity density distributions.

On the other hand, when the simulative electric characteristics do not match the measured electric characteristics, the parameters are changed and the simulation is carried out by the use of changed parameters. These processes are repeated until the simulative electric characteristics practically match the measured electric characteristics.

Thus, the conventional reverse profiling method finds two dimensional impurity density distributions of the semiconductor device at one time.

However, the conventional reverse profiling method has a problem that it can not quantitatively find modulated impurity density distributions. Moreover, the conventional reverse profiling method has another problem that it needs a long time to match the simulative electric characteristics with the measured electric characteristics. In addition, the conventional reverse profiling method has still another problem that each of the found impurity density profiles is not always unique.

Referring to FIGS. 2 through 5, the description will proceed to a reverse profiling method according to a first embodiment of this invention.

Figure 2:
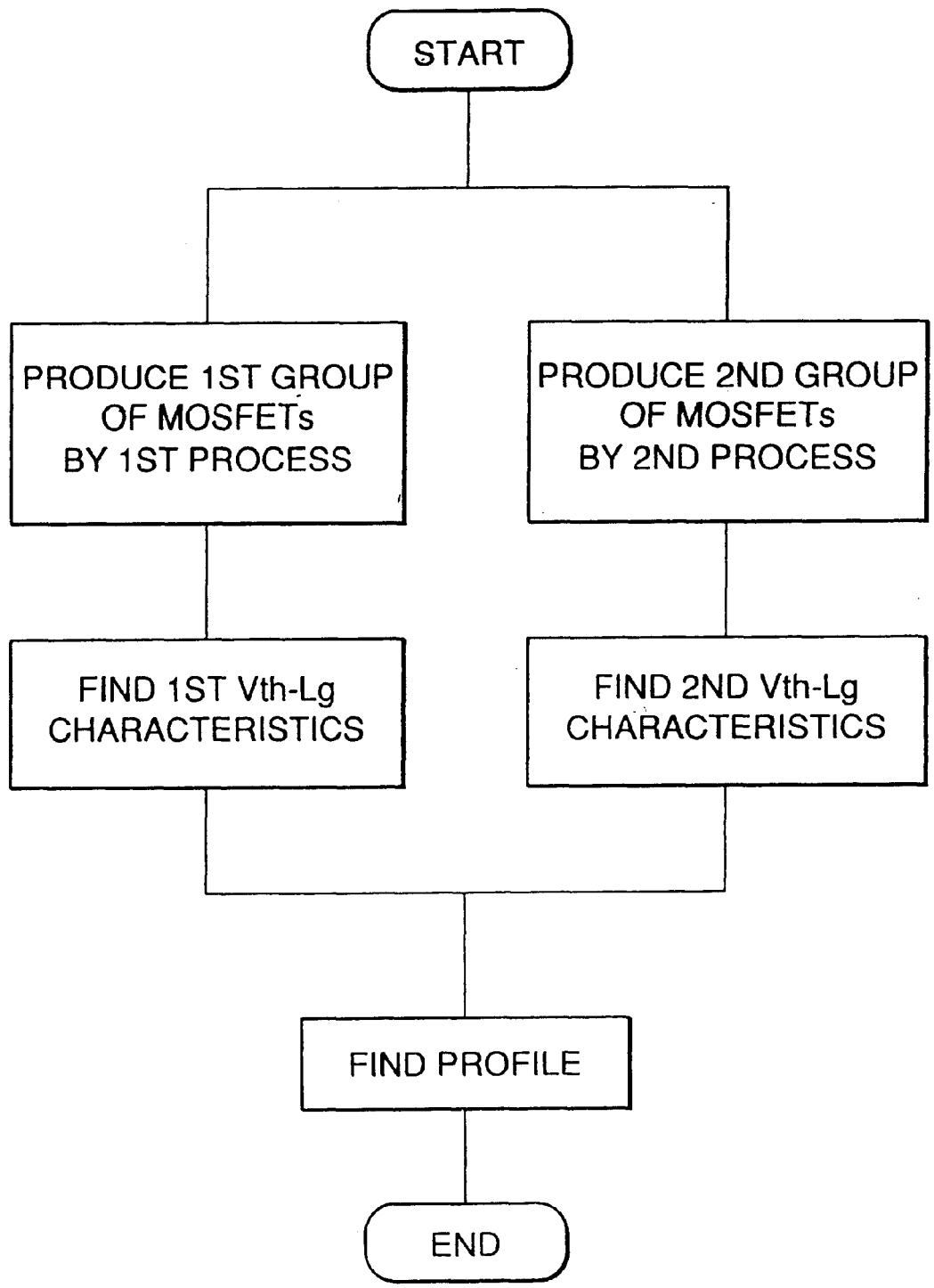
FIG. 2 is a flow chart of a reverse profiling method according to a first embodiment of this invention.

The reverse profiling method is performed along a flow chart as shown in FIG. 2. That is, first and second groups of MOSFETs are produced, first and second Vth-Lg characteristics of the first and the second groups are measured, and modulated impurity density distributions are found. The reverse profiling method will be described in more detail below.

A first process shown in FIGS. 3A–3E produces each of the MOSFETs of the first group. A second process shown in FIG. 3G–3K produces each of the MOSFETs of the second group.

In FIG. 3A, a semiconductor substrate 301 is prepared and a gate oxide film 302 is selectively formed on the semiconductor substrate 301. The gate oxide film 302 has a predetermined thickness. A gate 303 is formed on the gate oxide film 302. Channel ions 304 are implanted into the semiconductor substrate 301 with first dose and first implantation energy to form a channel region 305. The first implantation energy must be high so that the channel ions 304 reach the semiconductor substrate 301 through the gate 303 and the gate oxide film 302. The channel ions 304 act as channel impurities in the channel region 305.

In FIG. 3B, RTA (Rapid Thermal Annealing) is made to electrically activate the channel impurities.

In FIG. 3C, source/drain ions 306 are implanted into the semiconductor substrate 301 with second dose and second implantation energy to dope source/drain impurities and to form source/drain regions 307. The second implantation energy is lower than the first implantation energy. Consequently, the source/drain ions 306 are not doped under the gate oxide film 302. Namely, the gate 303 prevents the source/drain ions 306 from reaching the semiconductor substrate 301.

In FIG. 3D, annealing is carried out to reduce lattice defects and to make migration of the source/drain impurities.

Thus, the MOSFET is completed and has a final profile of imparity distribution as shown in FIG. 3E. If a mask pattern with different gate lengths is prepared, the MOSFETs of the same structure except for gate length can be produced by a single run of the first process. In other words, the MOSFETs of the first group have different gate length one another. This type of MOSFET will be called a channel preceding implanted device.

After the producing of the first group of the MOSFETs, threshold voltages (Vt) of the MOSFETs are detected. In each MOSFET, the threshold voltage depends on the gate length (Lg). Then, first Vt-Lg (threshold voltage-gate length) characteristics are obtained according to the detected threshold voltages and corresponding gate length. The first Vt-Lg characteristics are shown in FIG. 3F.

Similarly, the second process produces the MOSFETs of the second group so that the MOSFETs have the same structure as the MOSFETs of the first group. However, the MOSFETs of the second group is slightly different from the MOSFETs of the first group in structure as described later. The second process is performed as follows.

In FIG. 3G, a semiconductor substrate 321 is prepared and a gate oxide film 322 with the predetermined thickness is selectively formed on the semiconductor substrate 321. A gate 323 is formed on the gate oxide film 322. Then, source/drain ions 324 are implanted into the semiconductor substrate 321 with the second dose and the second implantation energy to dope source/drain impurities and to form source/drain regions 325. The source/drain ions are not doped under the gate oxide film 322.

In FIG. 3H, annealing is carried out to reduce lattice defects and to make migration of the source/drain impurities.

In FIG. 3I, channel ions 326 are implanted into the semiconductor substrate 321 with the first dose and the first implantation energy. The channel ions 326 are doped into the semiconductor substrate 321 under the oxide film 322 through the gate 323 and the gate oxide film 322 and act channel impurities to form a channel region 327.

In FIG. 3J, the RTA is carried out to electrically activate the channel impurities.

Thus, the MOSFET is completed and has a final profile of imparity distribution as shown in FIG. 3K. If a mask pattern with different gate lengths is prepared, the MOSFETs of the same structure except for gate length can be produced by a single run of the second process. In other words, the MOSFETs of the second group have different gate length. This type of MOSFET will be called an S/D preceding implanted device.

After the producing of the MOSFETs of the second group, threshold voltages (Vt) of the MOSFETs are detected. In each MOSFET, the threshold voltage depends on the gate length (Lg). Second Vt-Lg characteristics are obtained according to the detected threshold voltages and corresponding gate length of the MOSFETs of the second group. The second Vt-Lg characteristics are shown in FIG. 3L.

As shown in FIGS. 3F and 3L, a first curve representative of the first Vt-Lg characteristics has a hump while a second curve representative of the second Vt-Lg characteristics has no hump. The difference between the first curve and the second curve is based on the following reason.

In the first process, lattice defects made by the implantation of the S/D ions make the channel impurities acceleratingly diffuse when the annealing is carried out. That is, the distribution of the channel impurities is partially modulated by the annealing. This modulation appears as pileup that the channel impurities partially move toward the gate oxide film (or interface between silicon and oxide film) and increase the threshold voltage at corresponding area. Therefore, the channel preceding implanted device has inverse short channel effect.

On the other hand, in the second process, lattice defects made by the implantation of the S/D ions are removed by annealing after the implantation of the S/D ions. Consequently, the implantation of the S/D ions does not modulate distribution of the channel impurities later. Moreover, lattice defects brought by the implantation of the channel ions are uniformly distributed in the channel region. Consequently, the RTA uniformly makes accelerative diffusion of the channel impurities after the implantation of the channel ions and does not modulate the distribution of the channel impurities. Therefore, the S/D preceding implanted device has no inverse short channel effect.

Herein, it is assumed that modulation quantity of the channel impurities of the channel preceding implanted device has a surface density distribution $N_{mod}(x)$ that is a function of x representative of a distance from one of gate edges closing source/drain region. Moreover, it is assumed that the surface density distribution $N_{mod}(x)$ is independent of channel length and is symmetric with respect to center line between the gate edges.

Under the assumption, the difference between the threshold voltage of the S/D preceding implanted device and that of the channel preceding implanted device is given by:

$$V_{thPRE}(L_g) - V_{thPOST}(L_g) = q \frac{t_{OX}}{\varepsilon_{OX}} \frac{2}{L_g} \int_0^{L_g/2} N_{mod}(x) dx \quad (1)$$

where, $V_{thPRE}(L_g)$ is a threshold voltage of the channel preceding implanted device with gate length $L_g$, $V_{thPOST}(L_g)$ is a threshold voltage of the S/D preceding implanted device with the gate length $L_g$, q is the electron charge, $t_{OX}$ is thickness of the gate oxide film, and $e_{OX}$ is a dielectric constant of the gate oxide film.

Figure 4:
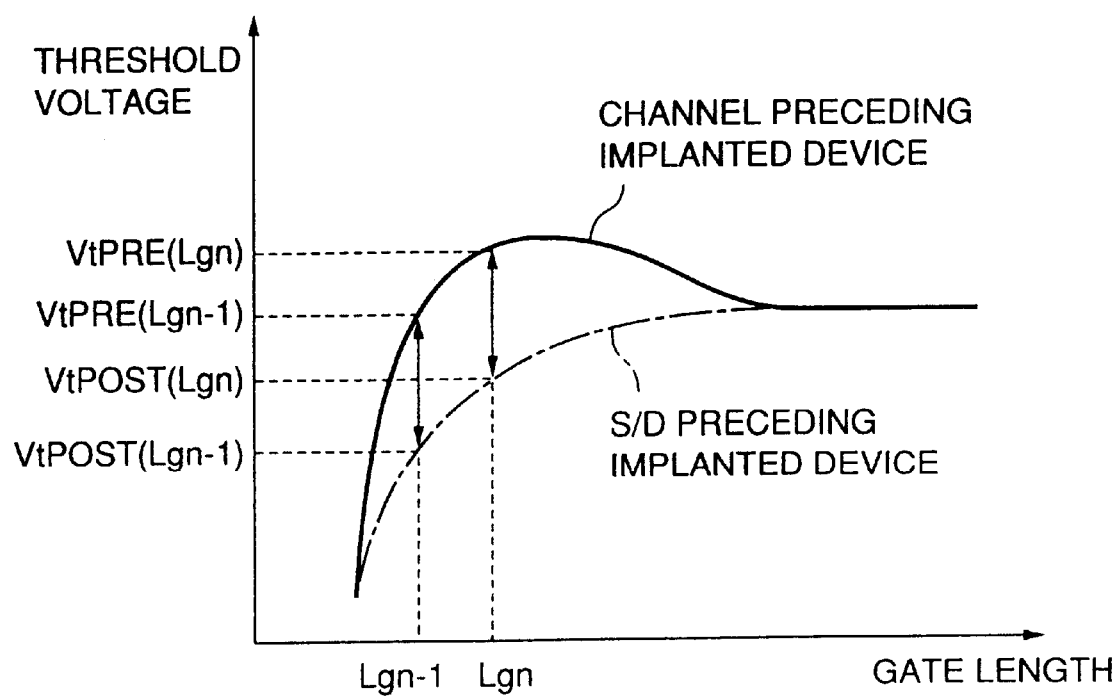
FIG. 4 is a graph showing Vt-Lg characteristics of MOSFETs produced by the process shown in FIG. 3A–3E and 3G–3K.

FIG. 4 shows a combination of the first curve illustrated in FIG. 3F and the second curve illustrated in FIG. 3L. In FIG. 4, two gate length standards $L_{gn-1}$ and $L_{gn}$ (n=3,4,5, ... ) are assumed and adjoin to each other. The gate length standards $L_{gn-1}$ and $L_{gn}$ (n=3,4,5, ... ) can be optionally decided. If the gate length standards $L_{gn-1}$ and $L_{gn}$ are substituted for $L_g$ in the equation (1), respectively, two equations are obtained. Then, difference of the obtained two equations is given by:

$$V_{thPRE}(L_{gn}) - V_{thPOST}(L_{gn}) - \{V_{thPRE}(L_{gn-1}) - V_{thPOST}(L_{gn-1})\} = \quad (2)$$

$$q \frac{t_{OX}}{\varepsilon_{OX}} \frac{2(L_{gn-1} - L_{gn})}{L_{gn-1} L_{gn}} \int_0^{L_{gn-1}/2} N_{mod}(x) dx +$$

$$q \frac{t_{OX}}{\varepsilon_{OX}} \frac{2}{L_{gn}} \int_{L_{gn-1}/2}^{L_{gn}/2} N_{mod}(x) dx.$$

If $N_{mod}(x)$ is considered to be constant in the $L_{gn-1}$ to $L_{gn}$ gate length range, an approximate equation of the equation (2) is given by:

$$V_{thPRE}(L_{gn}) - V_{thPOST}(L_{gn}) - \{V_{thPRE}(L_{gn-1}) - V_{thPOST}(L_{gn-1})\} = \quad (3)$$

$$q \frac{t_{OX}}{\varepsilon_{OX}} \frac{L_{gn} - L_{gn-1}}{L_{gn}} N_{mod}\left(\frac{L_{gn} + L_{gn-1}}{4}\right) -$$

$$q \frac{t_{OX}}{\varepsilon_{OX}} \frac{L_{gn} - L_{gn-1}}{L_{gn} L_{gn-1}} \sum_{i=1}^{n-2} (L_{gi+1} - L_{gi}) N_{mod}\left(\frac{L_{gi+1} + L_{gi}}{4}\right).$$

The equation (3) is arranged and changed into a recurrence formula that is given by:

$$N_{mod}\left(\frac{L_{gn} + L_{gn-1}}{4}\right) = \quad (4)$$

$$\frac{L_{gn}}{L_{gn} - L_{gn-1}} \frac{1}{q} \frac{\varepsilon_{OX}}{t_{OX}} [\{V_{thPOST}(L_{gn}) - V_{thPRE}(L_{gn})\} -$$

$$\{V_{thPOST}(L_{gn-1}) - V_{thPRE}(L_{gn-1})\}] -$$

$$\frac{1}{L_{gn-1}} \sum_{i=1}^{n-2} (L_{gi+1} - L_{gi}) N_{mod}\left(\frac{L_{gi+1} + L_{gi}}{4}\right).$$

If the gate length standards $L_{gn-1}$ and $L_{gn}$ (n=3,4,5, ... ) and corresponding threshold voltages are substituted into the equation (4) in order of number of n, the modulated impurity surface density distribution $N_{mod}(x)$ can be found.

Figure 5:
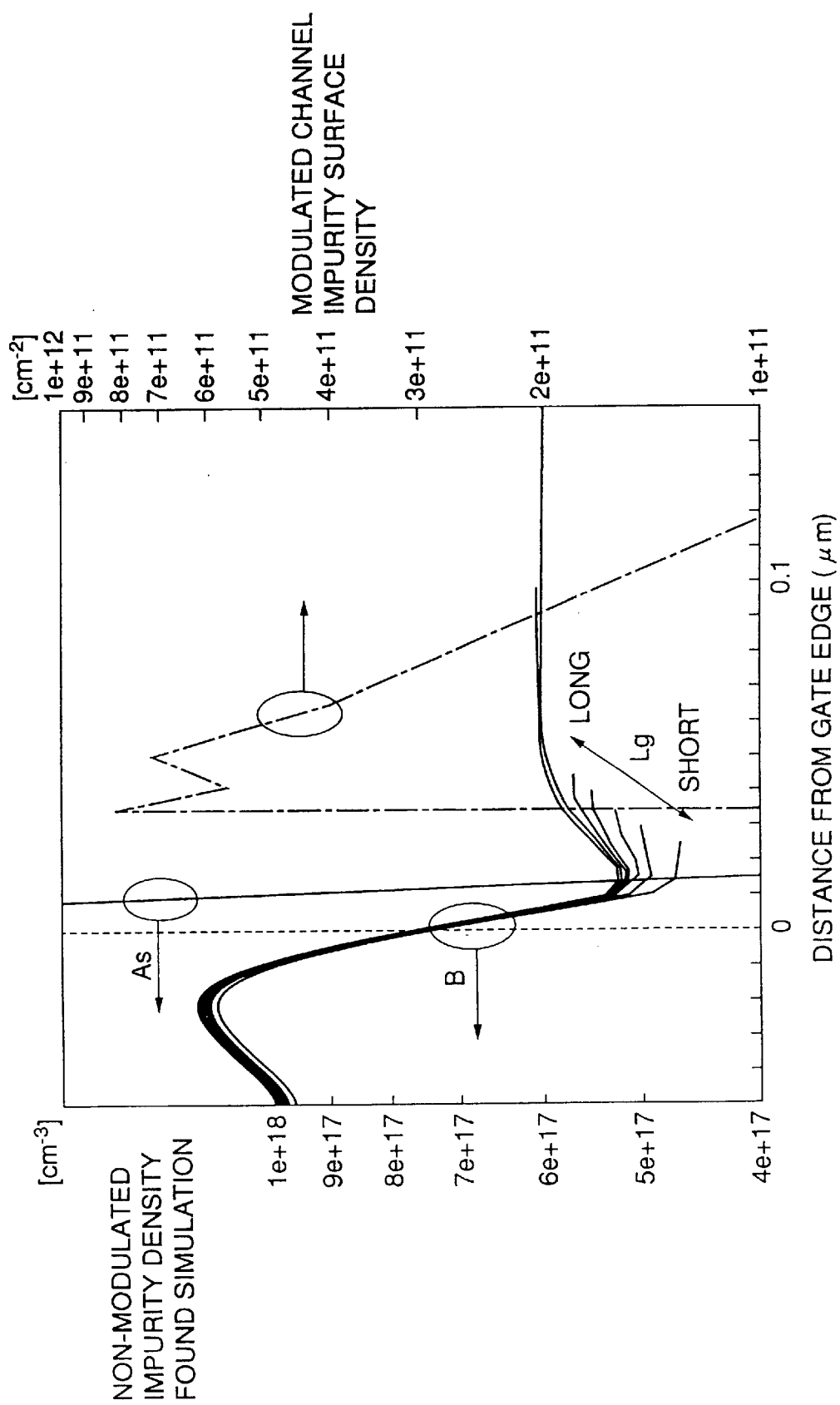
FIG. 5 is a graph showing modulated channel impurity surface density profiled by the use of the Vt-Lg characteristics shown In FIG. 4.

In FIG. 5, $N_{mod}(x)$ is shown by an alternate long and short dash line. Solid lines illustrated in FIG. 5 are non-modulated volume density distributions of the channel impurities (e.g. boron (B)) and the S/D impurities (e.g. arsenic (As)). Process simulations find the volume density distributions.

Thus, the reverse profiling method can quantitatively uniquely find the modulated impurity density distribution, which causes the inverse channel effect in the channel preceding implanted device.

Referring to FIG. 6, the description will be made about a reverse profiling method according to a second embodiment of this invention.

In the reverse profiling method, primary and secondary processes produce primary and secondary groups of a plurality of MOSFETs, respectively. The primary process is shown in FIGS. 6A–6E while the secondary process is shown in FIGS. 6G–6J. The secondary process is well known process for producing a general MOSFET.

In FIG. 6A, channel ions 601 are implanted to a semiconductor substrate 602 to form a channel region 603. Moreover, a gate oxide film 604 is formed on the semiconductor substrate 602.

In FIG. 6B, a gate 605 is formed on the gate oxide film 604 and both of the gate 605 and the gate oxide film 604 are selectively removed to have predetermined shape. Source/drain ions 606 are implanted into the semiconductor substrate 602 to form source/drain regions 607.

In FIG. 6C, silicon ions 608 are implanted to the semiconductor substrate 602. The silicon ions act as neither donors nor acceptors.

In FIG. 6D, annealing is carried out to reduce lattice defects and to make migration of all of the implanted ions.

Figure 6G:
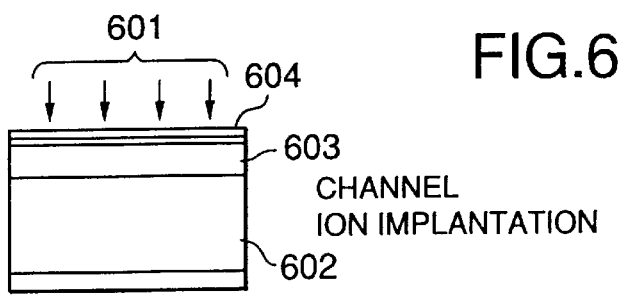
Figure 6G:
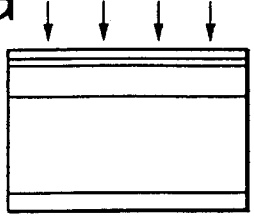
Figure 6H:
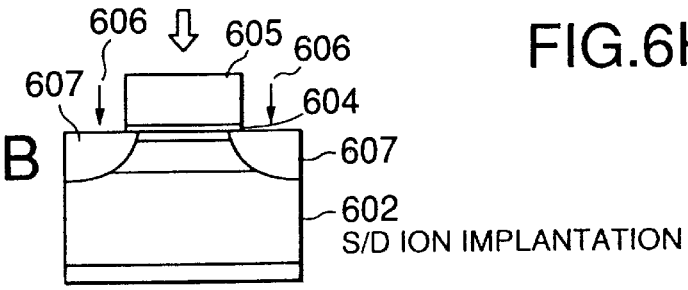
Figure 6H:
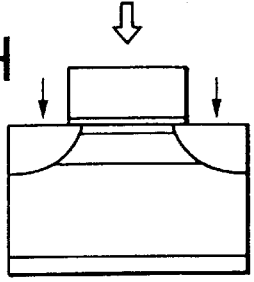
Figure 6E:
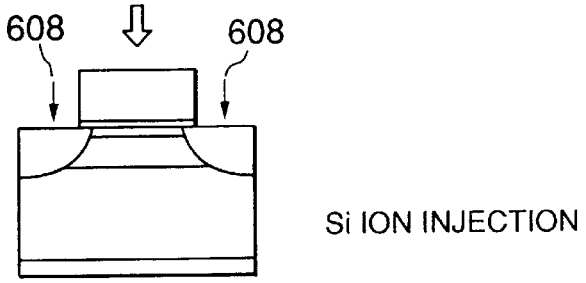
Figure 6E:
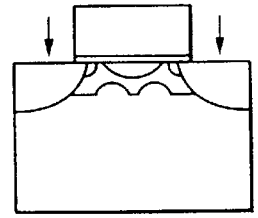
Figure 6J:
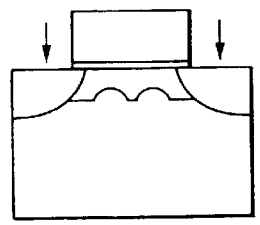

Thus, the MOSFET is completed and has a final profile of imparity distribution as shown in FIG. 6E. The primary group of MOSFETs is produced at a time by using a mask pattern with different gate lengths. This type of MOSFET is called an Si implanted device.

Figure 6F:

Subsequently, primary Vt-Lg characteristics shown in FIG. 6F are found by the way as mentioned above about the first embodiment.

On the other hand, general MOSFETs are produced the same way as the primary process except for the implantation of the silicon ions. Then, secondary Vt-Lg characteristics shown in FIG. 6K are obtained on the basis of threshold voltages and channel length of the general MOSFETs of the secondary group.

Figure 6K:
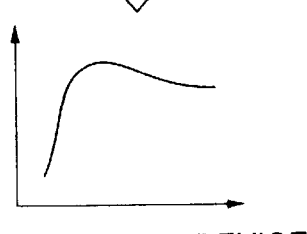

As easily understood from FIGS. 6F and 6K, inverse channel effects are caused in both the Si implanted MOSFETs and the general MOSFETs. Namely, a primary curve of the primary Vt-Lg characteristics and a secondary curve of the secondary Vt-Lg characteristics have humps, respectively. However, the humps are different from each other in size. Accordingly, the modulated impurity density distribution based on the difference of humps is found by the use of the primary and the secondary Vt-Lg characteristics with the equation (4).

Therefore, the reverse profiling method can quantitatively uniquely find the modulated impurity density distribution, which causes the inverse channel effect in the Si implanted device.

While this invention has thus for been described in conjunction with the preferred embodiments thereof, it will readily be possible for those skilled in the art to put this invention into practice in various other manners.

What is claimed is:

1. A reverse profiling method for profiling a modulated impurity density distribution of a specific semiconductor device with a specific structure, said specific semiconductor device produced by a first producing process which invites inverse short channel effect, said reverse profiling method comprising:

producing first semiconductor devices by the first producing process so that said semiconductor devices have the specific structure in common except for gate length, finding first threshold voltage-gate length characteristics based on threshold voltages and gate length of said first semiconductor devices, producing second semiconductor devices by a second producing process which is less likely to invite the inverse short channel effect than the first producing process so that said second semiconductor devices have the specific structure in common except for gate length, finding second threshold voltage-gate length characteristics based on threshold voltages and gate length of said second semiconductor devices, and finding said modulated impurity density distribution of said specific semiconductor device on the basis of said first threshold voltage-gate length characteristics and said second threshold voltage-gate length characteristics.

2. A reverse profile method as claimed in claim 1, wherein a plurality of gate length standards is predetermined, and wherein finding said modulated impurity density distribution comprises:

finding a first set of threshold voltages corresponding to the gate length standards on the basis of the first threshold voltage-gate length characteristics, finding a second set of threshold voltages corresponding to the gate length standards on the basis of the second threshold voltage-gate length characteristics, and evaluating the first set and the second set.

3. A reverse profiling method as claimed in claim 2, wherein said specific semiconductor device, said first semiconductor devices and the second semiconductor devices are MOSFETs.

4. A reverse profiling method as claimed in claim 3, wherein each of the MOSFETs has a gate oxide film and a gate edge closing to a source or a drain region, wherein the modulated impurity density distribution is found by the use of an equation of $$N_{mod}\left(\frac{L_{gn} + L_{gn-1}}{4}\right) = \frac{L_{gn}}{L_{gn} - L_{gn-1}} \frac{1}{q} \frac{\varepsilon_{OX}}{t_{OX}} [\{V_{thPOST}(L_{gn}) - V_{thPRE}(L_{gn})\} - \{V_{thPOST}(L_{gn-1}) - V_{thPRE}(L_{gn-1})\}] - \frac{1}{L_{gn-1}} \sum_{i=1}^{n-2} (L_{gi+1} - L_{gi}) N_{mod}\left(\frac{L_{gi+1} + L_{gi}}{4}\right)$$

, where $N_{mod}(x)$ is the modulated impurity density at a distance of x from said gate edge, $L_{gn}$ is n-th gate length standard ($n \geq 3$, natural number), $V_{thPRE}(L_{gn})$ is the threshold voltage according to the n-th gate length standard on the basis of the first threshold voltage-gate length characteristics, $V_{thPOST}(L_{gn})$ is the threshold voltage according to the n-th gate length standard on the basis of the second threshold voltage-gate length characteristics, q is the electron charge, $e_{OX}$ is a dielectric constant of said gate oxide film, and $t_{OX}$ is thickness of said gate oxide film.

5. A reverse profiling method as claimed in claim 4, wherein said first producing method comprises the step of:

implanting channel impurities into a first substrate, activating said channel impurities, implanting source/drain impurities into said first substrate after the activating step, and annealing said first substrate, said second producing method comprising the step of:

implanting source/drain impurities into a second substrate, annealing said second substrate, implanting channel impurities into said second impurities after the annealing step, and activating said channel impurities.

6. A reverse profiling method as claimed in claim 4, wherein said first producing method comprises the step of:

implanting source/drain impurities into a first substrate, and implanting inactive elements into the first substrate, and annealing the first substrate after the implanting step for implanting said inactive elements, said second producing method comprising the step of:

implanting source/drain impurities into a second substrate, and annealing the second substrate after the implanting step for implanting said source/drain impurities into said second substrate.

7. A reverse profiling method as claimed in claim 6, wherein said inactive elements are silicon ions.

* * * * *